United States Patent
Kawashima

(10) Patent No.: US 7,649,223 B2
(45) Date of Patent: Jan. 19, 2010

(54) SEMICONDUCTOR DEVICE HAVING SUPERJUNCTION STRUCTURE AND METHOD FOR MANUFACTURING THE SAME

(75) Inventor: Yoshiya Kawashima, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 286 days.

(21) Appl. No.: 11/819,677

(22) Filed: Jun. 28, 2007

(65) Prior Publication Data
US 2008/0001217 A1   Jan. 3, 2008

(30) Foreign Application Priority Data
Jul. 3, 2006   (JP)   ............................. 2006-183935

(51) Int. Cl.
H01L 29/732   (2006.01)
H01L 29/772   (2006.01)

(52) U.S. Cl. ...................... 257/332; 257/288; 257/367; 257/374; 257/376; 257/397; 257/409; 257/488; 257/490; 257/E27.06; 257/E29.017; 257/E29.014; 257/E29.062

(58) Field of Classification Search ................. 257/288, 257/232, 367, 374, 376, 397, 409, 488, 490, 257/E27.06, E29.017, E29.014, E29.062
See application file for complete search history.

(56) References Cited

U.S. PATENT DOCUMENTS

| 6,512,268 | B1 | 1/2003 | Ueno |
| 6,844,592 | B2 | 1/2005 | Yamaguchi et al. |
| 7,470,953 | B2 * | 12/2008 | Takaya et al. ............... 257/330 |
| 2003/0222327 | A1 | 12/2003 | Yamaguchi et al. |
| 2007/0001194 | A1 * | 1/2007 | Ono et al. ................... 257/127 |

FOREIGN PATENT DOCUMENTS

| JP | 2001-135819 | 5/2001 |
| JP | 2003-273355 | 9/2003 |
| JP | 2006-32420 | 2/2006 |

OTHER PUBLICATIONS

Takaya et al., "Floating Island and Thick Bottom Oxide Trench Gate MOSTFET (FITMOS)—A 60V Ultra Low-Resistance Novel MOSFET with Superior Internal Body Diode," Proceedings of 17th Int'l Symp. on Power Semicond. Dev. & IC's (May 23-26, 2005).

* cited by examiner

Primary Examiner—Ngan Ngo
Assistant Examiner—Benjamin Tzu-Hung Liu
(74) Attorney, Agent, or Firm—Young & Thompson

(57) ABSTRACT

An n-type drift region includes an active element region and a peripheral region. A p-type base region is formed at least in the active element region. A trench-type gate electrode is formed in each of the active element region and the peripheral region. An n-type source region formed in the base region. A plurality of p-type column regions is selectively formed separately from one another in each of the active element region and the peripheral region. In a peripheral region, a p-type guard region is formed below the gate electrode. In the active element region, the p-type guard region is not formed below the gate electrode. As a result, it is possible to hold the breakdown voltage in the peripheral region at a higher level than in the active element region while maintaining the low ON resistance due to a superjunction structure and to raise the breakdown voltage performance of the semiconductor device.

18 Claims, 12 Drawing Sheets

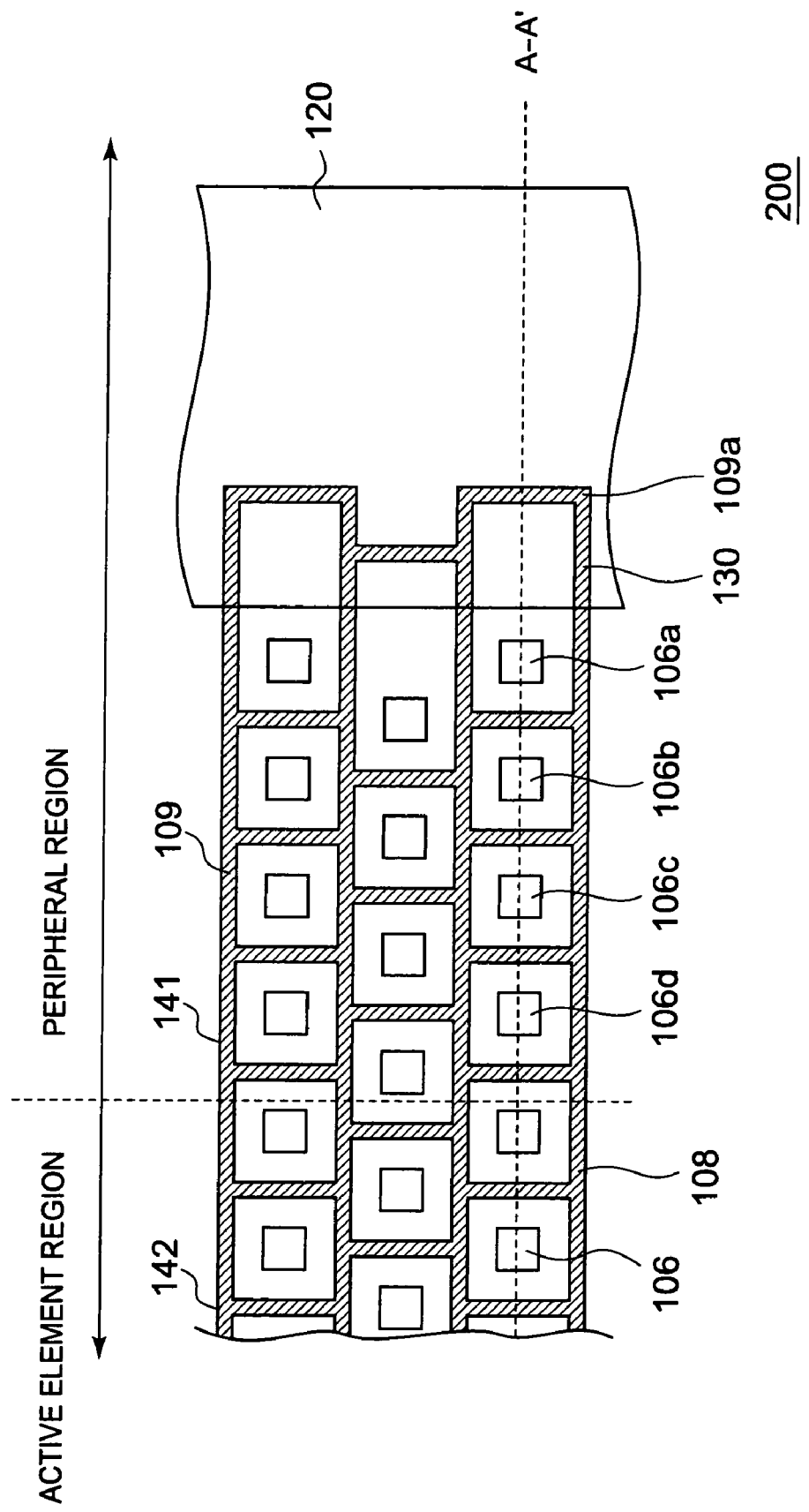

SEMICONDUCTOR DEVICE HAVING SUPERJUNCTION STRUCTURE AND METHOD FOR MANUFACTURING THE SAME

CROSS REFERENCE TO RELATED APPLICATION

This application is based upon, claims the benefit of priority of, and incorporates by reference the contents of Japanese Patent Application No. 2006-183935 filed on Jul. 3, 2006.

BACKGROUND OF THE INVENTION

1. Field of the Invention

The present invention relates to a semiconductor device and a method for manufacturing the semiconductor device. More particularly, the invention relates to a semiconductor device having a superjunction structure and a method for manufacturing the semiconductor device.

2. Description of the Related Art

Vertical power MOSFETs have been proposed as higher breakdown voltage metal-oxide semiconductor field-effect transistors (MOSFETs) Important characteristics of this type of higher breakdown voltage MOSFETs include lower ON resistance and higher breakdown voltage performance. ON resistance and breakdown voltage depend on the resistivity of a electric field relaxing layer and are in a tradeoff relation to each other in such a manner that ON resistance can be lowered by raising the impurity concentration in the electric field relaxing layer, thereby lowering the resistivity, whereas breakdown voltage decreases simultaneously.

In recent years, as a technique for lowering ON resistance while maintaining breakdown voltage performance in higher breakdown voltage MOSFETs, superjunction structures have been proposed.

FIG. 1 is a sectional view that shows the construction of unit structure in an active element region in a related art semiconductor device having such a superjunction structure.

A semiconductor device 1 includes a semiconductor body 2, an n-type drift region 3 that is formed on the semiconductor body 2 and functions as an electric field relaxing layer, a base region 4 formed on the n-type drift region 3, a source region 5 formed in the base region 4, a gate insulating film 6, a gate electrode 7 formed on the gate insulating film 6, an insulating film 8 formed on the gate electrode 7, a source electrode 9 that is formed on the insulating film 8 and is connected to the source region 5, a p-type column region 10 formed between two gate electrodes 7 that are adjacent to each other in the n-type drift region 3, and a drain electrode 11 formed on a rear surface of the semiconductor body 2. In an actual semiconductor device, this unit structure is cyclically formed in a transverse direction in the figure.

The semiconductor body 2, the n-type drift region 3 and the source region 5 are of the same conductivity type (an n-type here). The base region 4 and the p-type column region 10 are of a conductivity type reverse to that of the n-type drift region 3 (a p-type here). Furthermore, in the n-type drift region 3 and the p-type column region 10, the impurity dose amounts of these regions are set substantially equal.

Next, the operation of the semiconductor device having a construction as described above. When a reverse-bias voltage is applied to between the drain and the source in a case where a bias voltage is not applied to between the gate and the source (the MOSFET is off), a depletion layer expands from two pn junctions of the base region 4 and the n-type drift region 3 and of the p-type column region 10 and the n-type drift region 3 and a leakage current between the drain and source is suppressed. That is, because an interface between the p-type column region 10 and the n-type drift region 3 extends in a longitudinal direction between the drain and the source, the depletion layer widens in a transverse direction from this interface. When the region of the distance d shown in FIG. 1 becomes depleted, the depletion layers that expands from the each pn junction of the n-type column region 10 and the n-type drift region 3 are coupled.

Therefore, when the p-type column region 10 and the n-type drift region 3 are regulated so that the distance d becomes sufficiently small, the breakdown voltage of the semiconductor device 1 does not depend anymore on the impurity concentration of the n-type drift region 3 that functions as an electric field relaxing layer. For this reason, by adopting a superjunction structure as described above, it becomes possible to maintain breakdown voltage performance while raising the impurity concentration of the n-type drift region 3, thereby lowering ON resistance.

Japanese Patent Laid-Open No. 2001-135819 (a corresponding U.S. patent application number is U.S. Pat. No. 6,512,268 B1) discloses a semiconductor element having the above-described superjunction structure, although this is an example of a planar-type gate electrode MOSFET.

In a semiconductor element having a superjunction structure, a higher breakdown voltage is applied to the cell region as described above, and therefore it becomes important to ensure breakdown voltage at a junction-terminal region in a peripheral region that is formed at the periphery of an active element region. As a technique for applying higher breakdown voltage to a junction-terminal region, Japanese Patent Laid-Open No. 2003-273355 (a corresponding U.S. patent application number is US 2003/0222327 A1) discloses a construction of a semiconductor element which is such that in a planar-type gate electrode MOSFET having a superjunction structure, an n-type drift region and a p-type drift region are formed not only in a cell region, but also in the vicinity of a peripheral edge of a junction-terminal region.

A p-type base layer is formed on a p-type drift region in the vicinity of an interface with a cell region portion in the junction-terminal region. An insulating film is formed on a surface of the junction-terminal region, with the exception of part of this p-type base layer, and a field electrode is formed on this insulating film so as to surround the cell region portion. The field electrode comes into contact with a surface of the p-type base layer and is electrically connected to a source electrode. By adopting this structure, abrupt changes on the equipotential surface in the junction-terminal region are suppressed. As a consequence, in this structure, the field electrode is formed on the p-type drift region in the vicinity of the interface with the cell region portion in the junction-terminal region.

Takaya et al., "Floating Island and Thick Bottom Oxide Trench Gate MOSFET (FITMOS)", Proceedings of the 17$^{th}$ International Symposium on Power Semiconductor Devices & ICS, May 23-26, 2005, pp. 43-46 (hereinafter referred to as "Takaya et al.") and Japanese Patent Laid-Open No. 2006-32420 disclose a semiconductor device which is such that a thick oxide film, an n-type drift region and a reverse conduction type (p-type) region are provided below a trench-type gate electrode of vertical MOSFET formed in a cell region. It is claimed that thanks to this construction, higher breakdown voltage designs become possible and ON resistance characteristics are improved. And it is described that a thick oxide film and a reverse conduction type region can be provided below a gate electrode formed not only in a cell region, but also in a pn junction terminal portion. As a result of this, it is claimed that it is possible to prevent an increase in the number of steps.

By setting the pitch between the column regions at a narrow value so that the whole of the p-type column region 10 and the n-type drift region 3 becomes depleted, the dependence of breakdown voltage on the impurity concentration of the n-type drift region 3 is suppressed and it becomes possible to raise the superjunction effect. Particularly, in a device having a low resistance (for example, on the order of not more than 100 V) between the drain and the source, it is desirable to form a fine superjunction structure. However, the present inventor recognized that there is a difficulty as described below. Even in a case where the pitch between the p-type columns regions 10 is set at a narrow value, when a step in which the material is subjected to high temperatures is performed thereafter, an impurity in the p-type column region 10 diffuses into the n-type drift region 3 and the p-type column region 10 widens in a transverse direction, with the result that it becomes difficult to narrow the pitch. For this reason, in a semiconductor device having a fine superjunction structure, it is necessary to examine a manufacturing process which is such that the number of heat cycles applied to the semiconductor device is reduced after the formation of the p-type column region 10.

As a procedure for manufacturing a semiconductor element which is such that as disclosed in Japanese Patent Laid-Open No. 2003-273355, an n-type drift layer (an n-type drift region) and a p-type drift layer (a p-type column region) are formed also in a junction-terminal region and a field electrode is formed also thereon, the following methods are available:
(1) After the formation of a p-type column region by ion implantation, a field electrode is formed on the column region.
(2) After the formation of a field electrode, ion implantation is performed from above the electrode and a p-type column region is formed.

As described above, in a semiconductor device having a fine superjunction structure, it is desirable that the number of heat cycles applied to the semiconductor device be as small as possible after the formation of the p-type column. Ordinarily the field electrode of the semiconductor element is formed by the growth of a polysilicon layer by the CVD (Chemical Vapor Deposition) method, the temperature of the semiconductor device becomes high during formation. For this reason, in the method (1) above, an impurity in the p-type column region diffuses into the n-type drift region during the formation of the field electrode and it becomes difficult to realize a fine superjunction structure.

On the other hand, in the method (2) above, it becomes possible to reduce the number of heat cycles, because the p-type column region is formed after the formation of the field electrode. FIG. 2 is a sectional view that shows the construction of an prototype semiconductor device in which after the formation of a field electrode, ion implantation is performed from above the electrode by the method (2) above and a p-type column region is formed.

A semiconductor device 12 includes a semiconductor body 13, an n-type drift region 14 that is formed on the semiconductor body 13 and functions as an electric field relaxing layer, a base region 15 formed on the n-type drift region 14, a source region 16 formed in the base region 15, a gate insulating film, a gate electrode 17 formed on the gate insulating film (and a connecting electrode 17a connected to the gate electrode 17), an insulating film 18 formed on the gate electrode 17, a source electrode 19 that is formed on the insulating film 18 and connected to the source region 16, a p-type column region 20 (and 20a) formed between two gate electrodes 17 that are adjacent to each other in the n-type drift region 14, a drain electrode 21 formed on a rear surface of the semiconductor body 13, and an element isolating region 22. The semiconductor device 12 has an active element region in which the gate electrode 17 is formed and a peripheral region formed at the periphery of the active element region. The semiconductor device 12 further includes a field electrode 23 formed on the semiconductor body 13 in the peripheral region. The field electrode 23 is electrically connected to the gate electrode 17 via the connecting electrode 17a formed in the peripheral region. The field electrode 23 is formed on almost the whole surface of the peripheral region in order to obtain a contact to the connecting electrode 17a.

The p-type column region 20 is formed by the ion implantation of a p-type impurity by using a mask having an opening of a prescribed pattern on the semiconductor body 13. In this construction, the method (2) above is used. Therefore, in the peripheral region, ion implantation is performed via the field electrode 23 that has already been formed. For this reason, the depth of the p-type column region 20a present in the peripheral region is smaller than the depth of the p-type column region 20 of the active element region. Because the above-described superjunction effect depends on the depth of a p-type column region, and the deeper the p-type column region, the greater the effect will be. Therefore, when a p-type column region in a peripheral region is formed in a shallow position, the breakdown voltage of the peripheral region becomes lower than the breakdown voltage of an active element region. As a result of this, the breakdown voltage of the whole semiconductor device 12 is determined by the breakdown voltage of the peripheral region. That is, even when an element in an active element region is manufactured by controlling various conditions in order to achieve a higher breakdown voltage, it becomes difficult to improve the breakdown voltage of the whole semiconductor device 12. From this point of view, it is necessary to manufacture a semiconductor device so that a withstand voltage higher than in an active element region can be maintained in a peripheral region.

In a vertical MOSFET element having a superjunction structure, by connecting a trench-type gate electrode formed in an active element region to a field electrode formed in a peripheral region of the active element region, it becomes possible to control the gate potential via the field electrode. For this reason, it is necessary that a connection point to the trench-type gate electrode be provided at least in one place on the peripheral region side outward from a pn junction terminal portion. From this necessity, a gate electrode that is not related to cell operations is formed in a peripheral region. Electric field intensity becomes apt to be increased under the gate electrode and this causes a deterioration in breakdown voltage.

Furthermore, the present inventor found out that in a construction which is such that a thick oxide film, an n-type drift region and a reverse conduction type (p-type) region are provided under a trench-type gate electrode, as disclosed in Takaya et al. and Japanese Patent Laid-Open No. 2006-32420, it is possible to reduce the electric field intensity under the gate electrode, whereas there arises the problem that in the cell region an increase in resistance and an increase in gate capacitance are caused.

SUMMARY

The present invention seeks to solve or improve, at least in part, the above problem and the gist of the invention resides in keeping the breakdown voltage at a higher level in a peripheral region than in an active element region while maintaining a lower ON resistance by the superjunction effect and raising the element breakdown voltage of the semiconductor device.

In accordance with a first feature of the present invention is a semiconductor device having superjunction structure. A drift region of a first conductivity type includes an active element region and a peripheral region. A first trench is formed in the peripheral region and a second trench is formed in the active element region. A gate insulating film and a gate electrode are formed in each of the first and second trenches. A plurality of column regions of a second conductivity type is selectively formed separately from one another in each of the active element region and the peripheral region. A guard region of the second conductivity type is formed below at least a portion of the first trench closest to the active element region, and the guard region is free from being formed below the second trench.

This allows the breakdown voltage to be kept at a higher level in a peripheral region than in an active element region while maintaining a lower ON resistance by the superjunction effect and the element breakdown voltage of the semiconductor device to be raised.

In accordance with a second feature of the present invention is a method for manufacturing a semiconductor device. A first trench is formed in a peripheral region with a guard region of a second conductivity type formed below the first trench. A second trench is formed in an active element region. A gate insulating film and a gate electrode are formed in each of the first and second trenches, and a field electrode is formed over the peripheral region. The field electrode is formed without covering a prescribed area to be formed at least one of column regions formed in the peripheral region that is disposed at least in a position closest to the active element region. After that, a plurality of column regions of the second conductivity type is formed in each of the active element region and the peripheral region.

This allows the number of heat cycles applied to the semiconductor device after formation of the column regions to be reduced.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 4 is a top view of a semiconductor device in the first embodiment of the present invention;

DETAILED DESCRIPTION OF THE PREFERRED EMBODIMENTS

Figure 1:
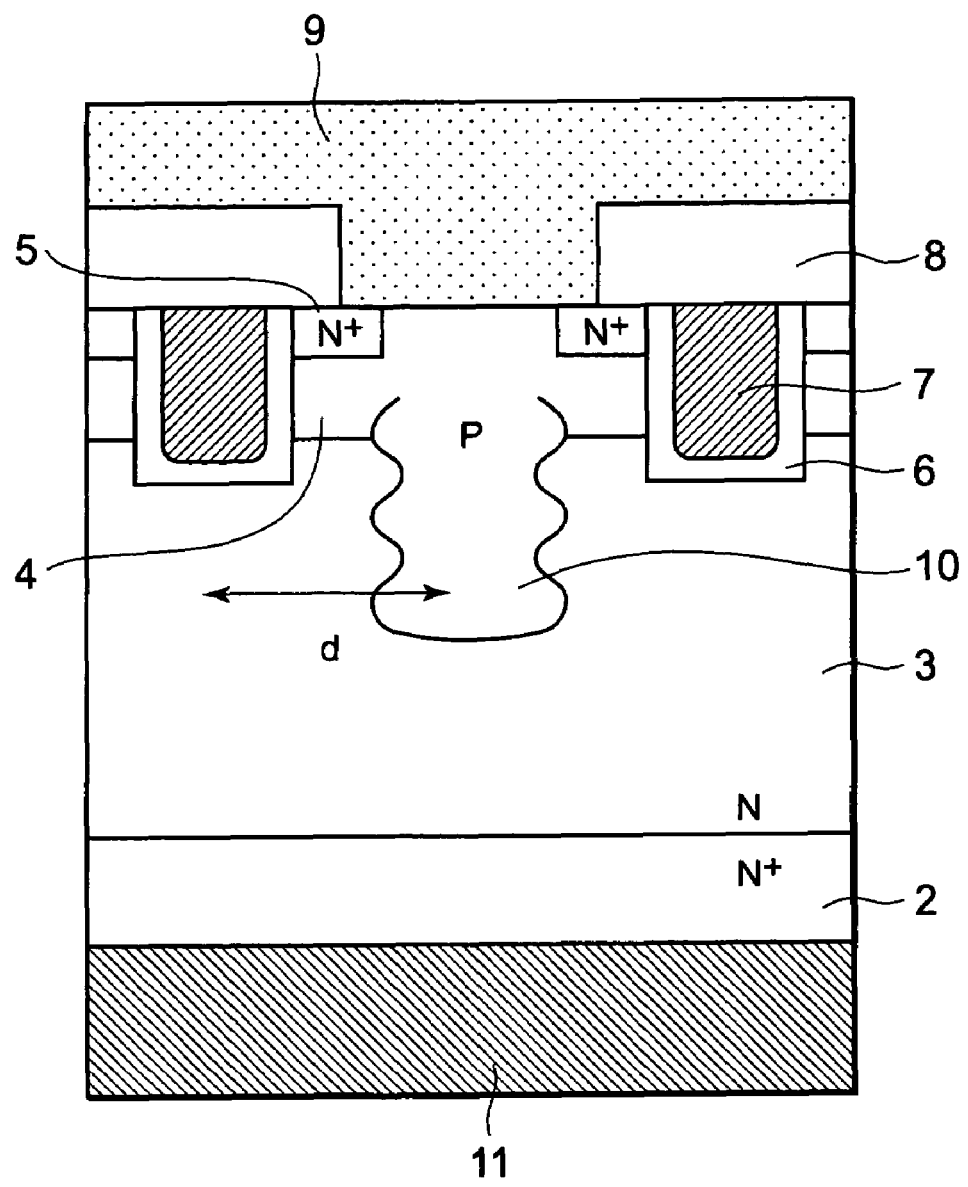
FIG. 1 is a sectional view that shows the construction of a cell-region unit structure in a related art semiconductor device having a superjunction structure.
Figure 2:
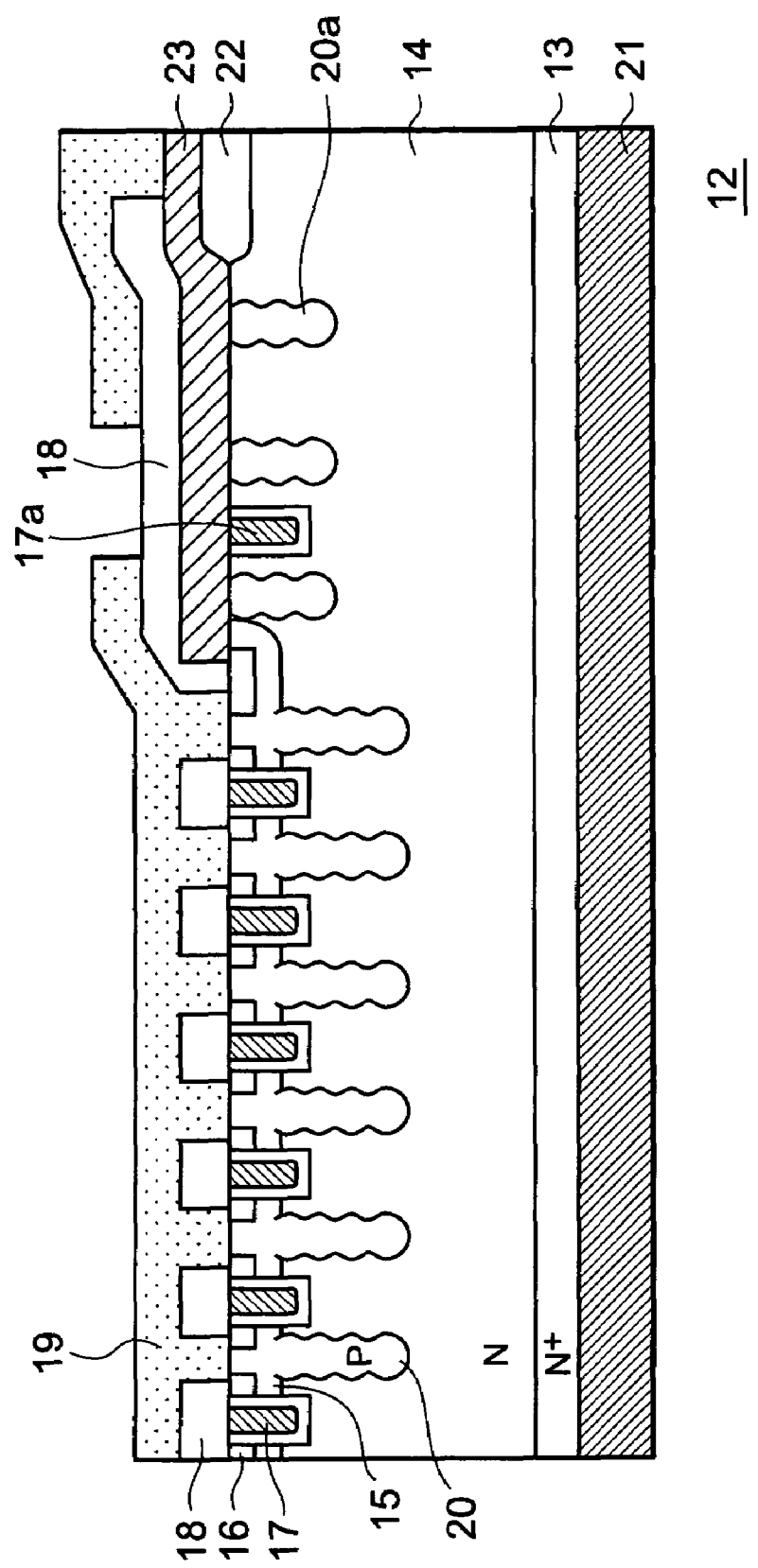
FIG. 2 is a sectional view that shows the construction of an prototype semiconductor device in which after the formation of a field electrode, ion implantation is performed from above the relevant electrode and a p-type column region is formed.

The invention will be now described herein with reference to illustrative embodiments. Those skilled in the art will recognize that many alternative embodiments can be accomplished using the teachings of present invention and that the invention is not limited to the embodiments illustrated for explanatory purposes.

Incidentally, in all of the drawings, like reference numerals refer to like component elements, whose descriptions are appropriately omitted. In the following embodiments of the present invention, the descriptions will be given of a case where a first conductivity type is an n-type and a second inductivity type is a p-type, which is taken as an example.

Figure 3:
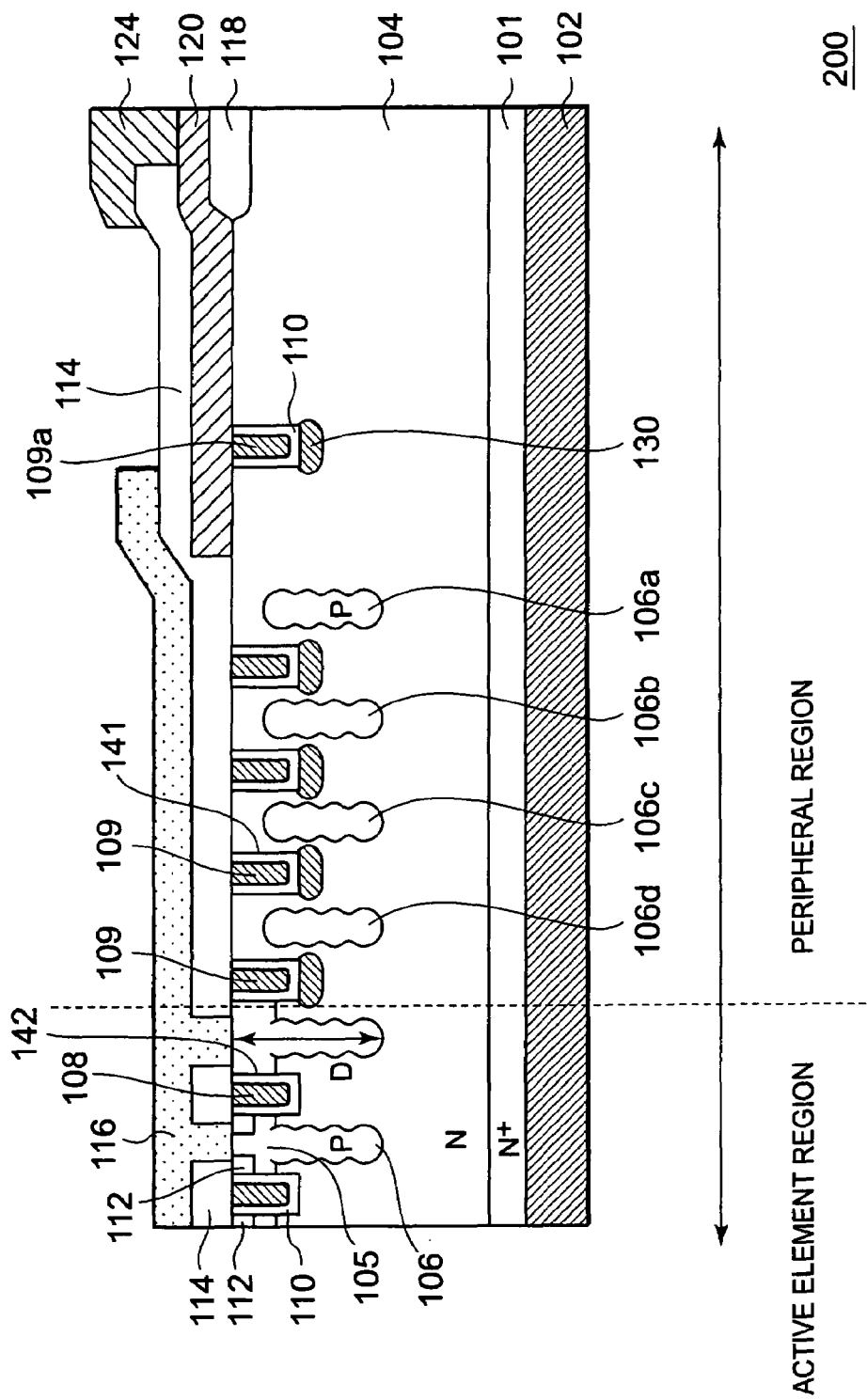
FIG. 3 is a sectional view of a semiconductor device in the first embodiment of the present invention.

FIGS. 3 and 4 are diagrams that show the construction of a semiconductor device 200 in the first embodiment of the present invention. FIG. 4 is a top view that shows the construction of the semiconductor device 200 in the first embodiment of the present invention. FIG. 3 is an A-A' sectional view of FIG. 4.

The semiconductor device 200 includes a vertical power MOSFET having a trench-type gate electrode as an active element. The semiconductor device 200 includes an active element region in which a MOSFET is formed and a peripheral region formed around the active element region.

The semiconductor device 200 includes a semiconductor body 101 of a first conductivity type, an n-type drift region 104 of the first conductivity type formed on the semiconductor body 101, p-type column regions of a second conductivity type 106a, 106b, 106c, 106d (hereinafter denoted as "106a to 106d") and 106 that are formed in the n-type drift region 104. The n-type drift region 104 is formed by epitaxial growth and functions as an electric field relaxing layer. In the upper portion of the n-type drift region 104, the p-type column regions 106, 106a to 106d are formed so as to be separated from one another. The plurality of p-type column regions 106 formed in the active element region is connected, in upper portions thereof, to a p-type base region 105. The region in which part of the n-type drift region 104 and the p-type column regions 106, 106a to 106d are alternately arranged, forms a parallel p-n layer. The parallel p-n layer is formed in an area extending from the active element region to part of the peripheral region. Incidentally, the p-type column regions 106 may also be separated from the p-type base region 105 without being connected thereto.

In the peripheral region, a first trench 141 is formed in the n-type drift region 104, and a gate insulating film 110, a trench-type gate electrode 109 and a connecting electrode 109a are formed in the first trench 141. In the active element region, an $n^+$-type source region 112 is formed above the p-type base region 105. A second trench 142 is formed from an upper surface of the $n^+$-type source region 112 to the n-type drift region 104, and the gate insulating film 110 and a trench-type gate electrode 108 are formed in the second trench 142. As shown in FIG. 4, the first trench 141 and the second trench 142 are interconnected. The gate electrode 108, the gate electrode 109 and the connecting electrode 109a are also interconnected. The gate electrode 108, the gate electrode 109 and the connecting electrode 109a are formed from polysilicon, for example. The n⁺-type source region 112 and the p-type base region 105 are formed so as to be adjacent to the gate electrode 108 via the gate insulating film 110. A channel region of the MOSFET is formed in the p-type base region 105 between the n⁺-type source region 112 and the n-type drift region 104. The n⁺-type source region 112 and the p-type base region 105 are electrically connected to a source electrode 116. Incidentally, FIG. 3 illustrates an example in which the p-type base region 105 is not formed in the peripheral region.

The source electrode 116 is formed in the active element region and the peripheral region and is formed so as to cover the p-type column regions 106a to 106d. An insulating film 114 is formed between the gate electrodes 108 and 109 and the source electrode 116 and between a field electrode 120 and the source electrode 116. The source electrode 116 in the peripheral region functions as a field plate, with the insulating film 114 serving as a field insulating film. A drain electrode 102 is formed below the semiconductor body 101 that functions as an n⁺-type drain region.

In the peripheral region, the n⁺-type source region 112 is not formed and no channel region is formed, either. Therefore, the gate electrode 109 and the connecting electrode 109a do not function as a gate electrode of the MOSFET. In the peripheral region, an element isolating region 118 is further formed.

The semiconductor device 200 includes the field electrode 120 formed in the peripheral region and an electrode 124 formed on the field electrode 120. The field electrode 120 is formed from polysilicon, for example, as with the gate electrodes 108 and 109 and the connecting electrode 109a. The field electrode 120 functions as a field plate, with the element isolating region 118 serving as a field insulating film. The field electrode 120 functions also as a gate finger that connects the connecting electrode 109a and the electrode 124 together. Incidentally, FIG. 3 illustrates an example in which no p-type column region is formed just under the field electrode 120.

As shown in FIG. 4, in the active element region, the gate electrode 108 is formed in the form of a mesh so as to surround each of the p-type column regions 106. Also in the peripheral region, the gate electrode 109 and the connecting electrode 109a are each formed in the form of a mesh so as to surround each of the p-type column regions 106a to 106d.

The field electrode 120 is formed outward from an area in which the p-type column regions 106a to 106d are formed in the peripheral region. The connecting electrode 109a is connected to the field electrode 120. Therefore, the field electrode 120 is electrically connected to the gate electrode 108 of the active element region via the connecting electrode 109a and the gate electrode 109.

Incidentally, FIG. 4 illustrates only the construction of the p-type column regions 106, 106a to 106d, the gate electrode 108, the gate electrode 109, the connecting electrode 109a and the field electrode 120. FIG. 4 shows an example in which the p-type column regions 106 are arranged in the form of an island and has a plane arrangement in the form of an orthorhombic lattice. The field electrode 120 is provided outward from the p-type column region 106a that is the outermost one.

That is, FIGS. 3 and 4 illustrate an example in which the field electrode 120 is formed outward from all of the p-type column regions 106a to 106d.

Again with reference to FIG. 3, the semiconductor body 101, the n-type drift region 104 and the n⁺-type source region 112 are of the same conductivity type (an n-type here). The p-type base region 105 and the p-type column regions 106, 106a to 106d are of a conductivity type reverse to that of the n-type drift region 104 (a p-type here). Furthermore, dose amounts of an impurity of the n-type drift region 104 of the parallel p-n layer and the p-type column regions 106, 106a to 106d are set at substantially equal values. FIG. 3 illustrates an example in which all of the p-type column regions 106 formed in the active element region are formed with almost the same depth D.

The semiconductor device 200 further includes a p-type guard region 130 formed below at least a portion of the first trench 141 closest to the active element region. That is, the p-type guard region 130 is formed below at least in a portion of the gate electrode 109 closest to the active element region. The p-type guard region 130 is constituted by a diffusion region of an impurity of a p-type, which is a conductivity type reverse to that of the n-type drift region 104. By adopting this construction, it is possible to reduce the electric field intensity under the gate electrode 109 in an area closest to the active element region. This enables the breakdown voltage of the peripheral region to be raised. The p-type guard region 130 is not formed in the active element region, i.e., below the second trench 142 including the gate electrode 108. Because this construction is adopted, deterioration in the characteristics in the active element region, such as an increase in ON resistance, does not occur. Therefore, it is possible to improve the breakdown voltage in the peripheral region while suppressing deterioration in the characteristics in the active element region. FIG. 3 illustrates an example in which the p-type guard region 130 is formed in the whole region of the first trench 141, i.e., below all of the gate electrode 109 and the connecting electrode 109a. In this embodiment, the p-type guard region 130 is formed in the form of a mesh in the same manner as with the first trench 141.

Next, the operation of the semiconductor device 200 will be described. While a voltage is being applied to the gate electrode 108, the p-type base region 105 becomes inverted in a location along the gate electrode 108 and forms a channel region. Furthermore, when a voltage is applied to the n⁺-type source region 112 via the source electrode 116, that is, when an ON condition has been produced, a current flows between the n⁺-type source region 112 and the n-type drift source 104 through the channel region and conduction is established between the source electrode 116 and the drain electrode 102. On the other hand, when there is no voltage application from the source electrode 116, that is, when an OFF condition has been produced, a depletion layer is formed at an interface between the p-type column regions 106 and the n-type drift region 104 and the conduction between the source electrode 116 and the drain electrode 102 does not occur any more.

Figure 5A:
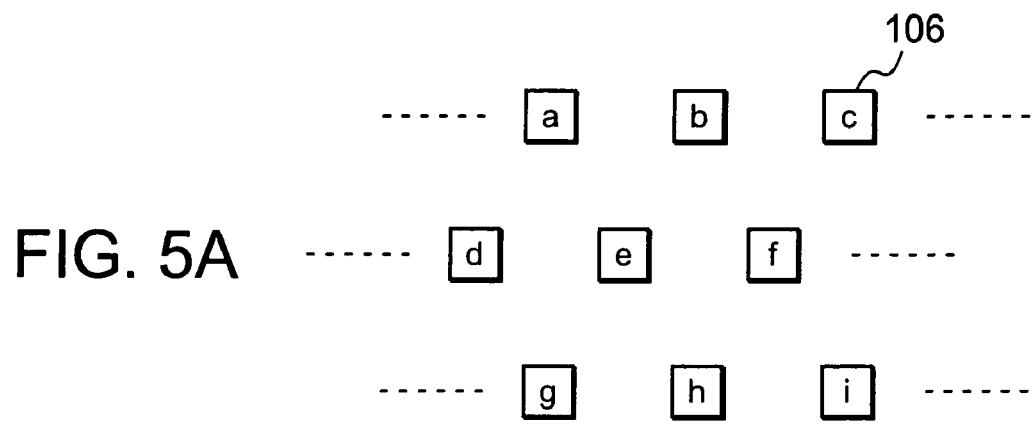
FIGS. 5A and 5B are diagrams that show examples of an arrangement of p-type column regions in the first embodiment of the present invention.
Figure 5B:
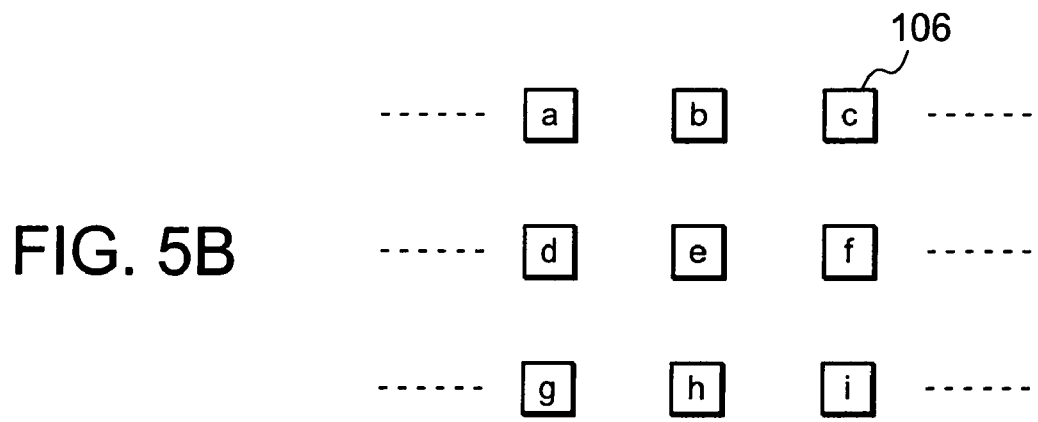

FIGS. 5A and 5B show the arrangement condition of p-type column regions 106 of the semiconductor device 200. Also each of the p-type column regions 106a to 106d can be similarly arranged. To identify each of the p-type column regions, these p-type column regions are each denoted by the reference characters "a," "b," "c," "d," "e," "f," "g," "h," and "i". When it is ensured that the p-type column regions 106 (106a to 106d) have a plane arrangement in the form of an orthorhombic lattice as shown in FIG. 5A, the island-like p-type column regions 106 (106a to 106d) can be arranged at mutually equal intervals. On the other hand, when the p-type column region is arranged in the form of a tetragonal lattice as shown in FIG. 5B, for example, the distance between the p-type column region of "e" and the p-type column regions of "b," "d," "f," and "h" becomes different from the distance between the p-type column region of "e" and the p-type column regions of "a," "c," "g," and "i". By arranging the island-like p-type columns at mutually equal intervals, it becomes possible to make equal the intervals between the p-type column regions 106 (106a to 106d) and the n-type drift region 104 (see FIG. 3) throughout the regions, and it becomes possible to ensure that the superjunction effect is well exhibited by maintaining the charge balance between the p type and the n type. The plane arrangement of the p-type column regions 106, 106a to 106d in the form of an orthorhombic lattice enables breakdown voltage performance to be raised more.

Figure 6A:
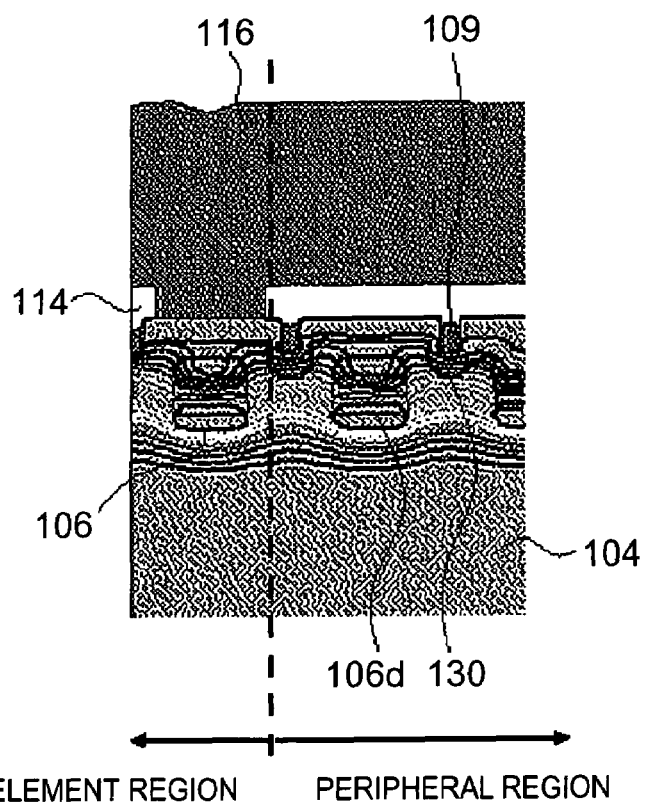
FIGS. 6A and 6B are sectional views that show the electric potential distribution, respectively, of a semiconductor device in the first embodiment of the present invention and a prototype.
Figure 6B:
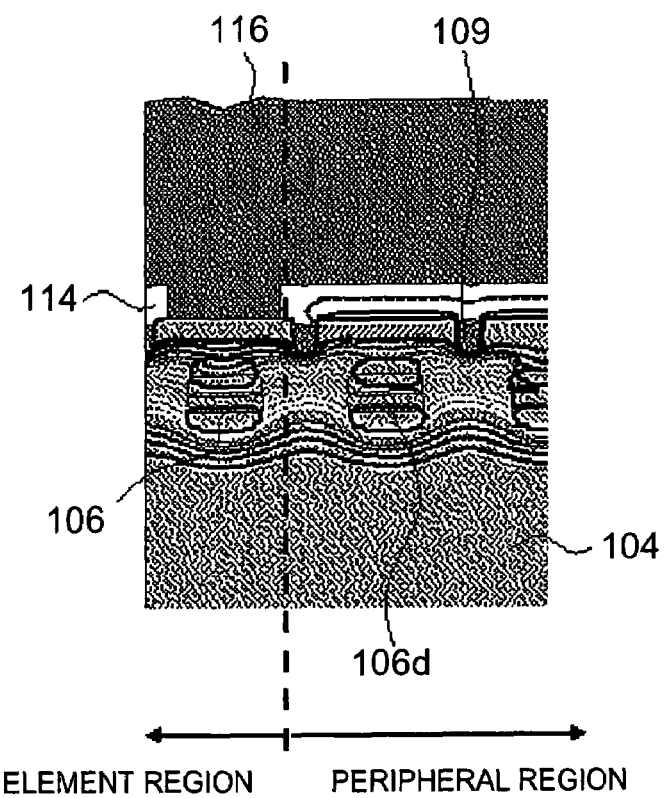

FIGS. 6A and 6B are sectional views that show the electric potential distribution, respectively, of the semiconductor device 200 and a semiconductor device of a prototype. FIG. 6A is the electric potential distribution of the semiconductor device 200 in which the p-type guard region 130 shown in FIG. 3 is formed. FIG. 6B is the electric potential distribution of a semiconductor device of a prototype in which this p-type guard region 130 is not formed. The curves in the diagrams indicate equipotential lines. The semiconductor device of the prototype shown in FIG. 6B has the same construction as the semiconductor device 200, with the exception that the p-type guard region 130 is not formed.

As described above, in order to raise the breakdown voltage as the whole semiconductor device, it is necessary to keep the breakdown voltage in the peripheral region at a higher level than the breakdown voltage in the active element region. A comparison between FIGS. 6A and 6B reveals that in the semiconductor device of the prototype shown in FIG. 6B, the intervals of the equipotential lines below a gate electrode 109 are narrow and it is apparent that electric field intensity is increased in this portion. The equipotential lines extend also into an insulating film 114, and an electric field higher than an electric field applied to a gate electrode 108 of the active element region is applied to the gate electrode 109 closest to the active element region. On the other hand, in the semiconductor device 200 shown in FIG. 6A, the p-type guard region 130 of a conductivity type reverse to that of the drift region 104 is formed under the gate electrode 109 closest to the active element region. Therefore, intervals of the equipotential lines under the gate electrode 109 shown in FIG. 6A are kept at constant intervals as compared with the prototype shown in FIG. 6B and it is apparent that the electric field intensity has been reduced.

Figure 7:
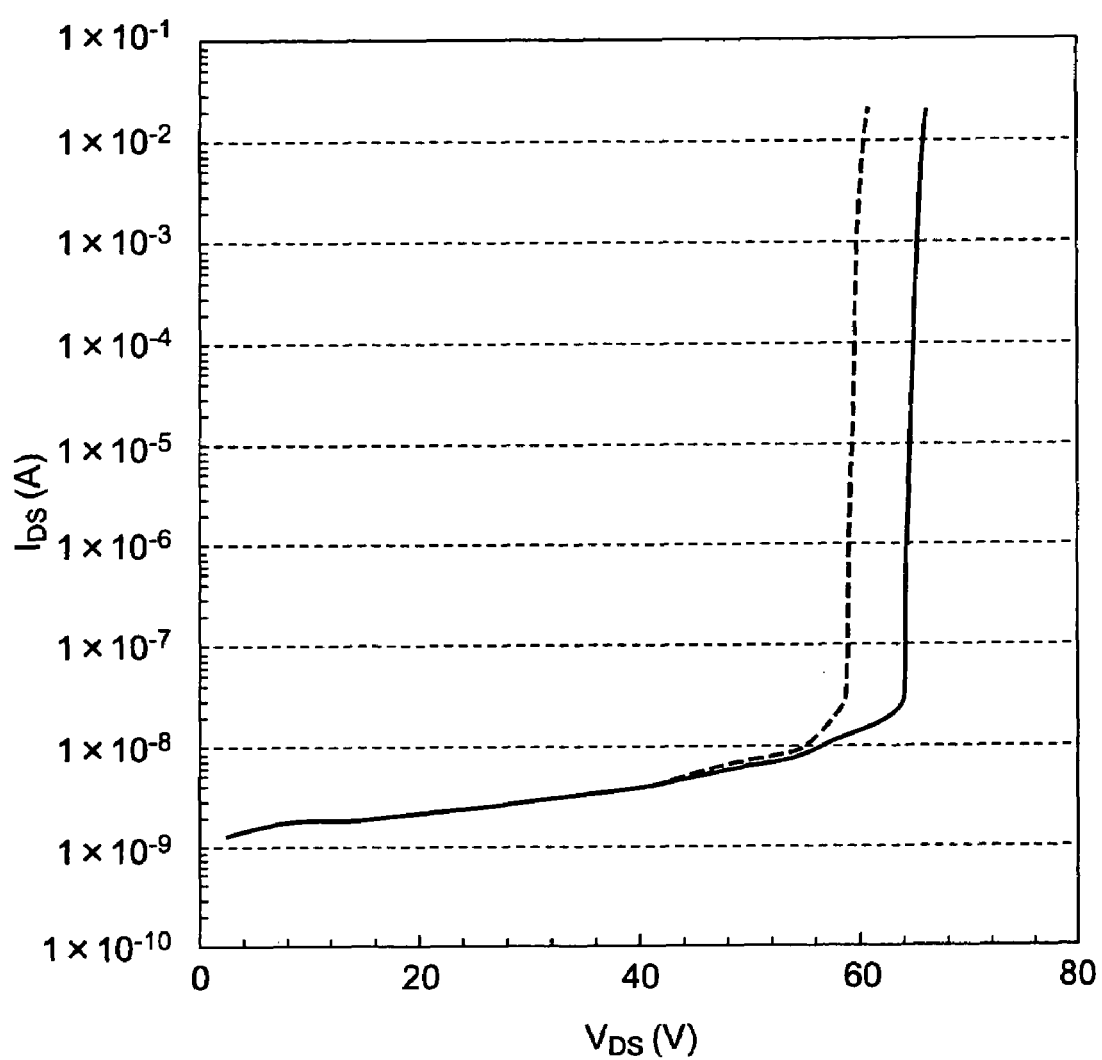
FIG. 7 is a diagram that shows the relationship between current and voltage of a semiconductor device in the first embodiment of the present invention and a prototype.

FIG. 7 is a diagram that shows current-voltage curves that are obtained when a reverse bias is applied to between the source and the drain in the semiconductor device 200 and the semiconductor device of the prototype. Measurement results of the semiconductor device 200 are indicated by a solid line and measurement results of the semiconductor device of the prototype are indicated by a broken line. For both semiconductor devices, the impurity concentration of the n-type drift, region 104 was $1.0 \times 10^{16}$ atoms/cm$^2$, and the p-type column regions 106 were formed with energy of up to 2.0 MeV by implanting ions in an amount of $4.0 \times 10^{12}$ atoms/cm$^2$ for each of the semiconductor devices so that the intervals of a depth (Rp) at which the implantation peak concentration becomes a maximum become constant. When a voltage at which $I_{DS}$ is equal to 1 mA is derived from the current-voltage curves, the voltage is 65.8 V in the semiconductor device 200 in which the p-type guard region 130 is formed and it is ascertained that a large value is obtained compared to 60.4 V in the semiconductor device of the prototype in which the p-type guard region 130 is not formed.

Next, the manufacturing process of the semiconductor device 200 in the first embodiment of the present invention will be described. FIGS. 8A and 8B and FIGS. 9A and 9B are sectional views of steps that show the manufacturing flow of the semiconductor device 200.

First, an n-type drift region 104 is formed on a principal surface of an n-type semiconductor body 101 of a high impurity concentration by the epitaxial growth of silicon while doping phosphorus (P), for example. Subsequently, in the peripheral region, an element isolating region 118 is formed on a surface of the n-type drift region 104. A LOCOS (Local Oxidation of Silicon) film is illustrated as the element isolating region 118, it is also possible to form the element isolating region 118 by a silicon oxide film, a silicon nitride film and the like deposited on the semiconductor body by the CVD method.

Subsequently, a p-type base region 105 is formed by the ion implantation of a p-type impurity, for example, boron (B) at least in the active element region of the surface of the n-type drift region 104 by use of a photolithography technique.

Figure 8A:
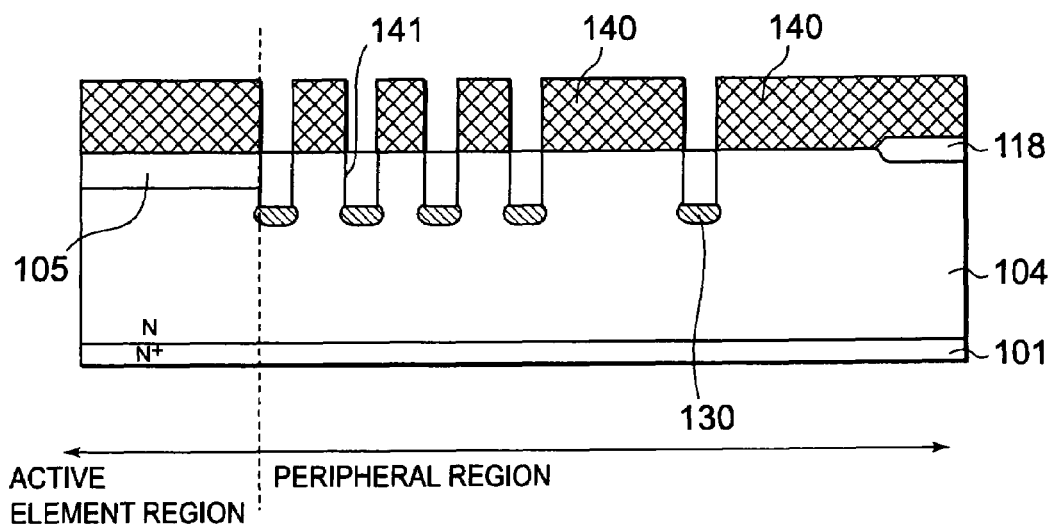
FIGS. 8A and 8B are sectional views of steps that show the manufacturing flow of a semiconductor device in the first embodiment of the present invention.

Next, in an area of the peripheral region where a gate electrode 109 and a connecting electrode 109a are to be formed, a first trench 141 is formed in an upper portion of the n-type drift region 104 by performing etching by use of a photo resist 140 as a mask. After that, a p-type guard region 130 is formed below the first trench 141 by the ion implantation of a p-type impurity, for example, boron (B) (FIG. 8A).

After the removal of the photo resist 140, in an area of the active element region where a gate electrode 108 is to be formed, a second trench 142 is formed in an upper portion of the n-type drift region 104 by performing etching by use of an unillustrated photo resist as a mask. As shown in FIG. 4, the first and second trenches 141 and 142 are connected to each other. Subsequently, a gate insulating film 110 formed from a silicon oxide film is formed by thermal oxidation on inner walls of the first and second trenches 141 and 142. Although at this time a silicon oxide film is formed also on the surface of the n-type drift region 104, this silicon oxide film is removed later. Subsequently, a polysilicon layer is formed by the CVD method in the interior of the first and second trenches 141 and 142 and on the surface of the n-type drift region 104. After that, by use of an unillustrated photoresist as a mask, the polysilicon layer in areas other than the interior of the first and second trenches 141 and 142 and a prescribed area of the peripheral region is selectively removed so that the polysilicon layer in the interior of the first and second trenches 141 and 142 and the prescribed area of the peripheral region is left behind. As a result of this, the gate electrode 108, the gate electrode 109, the connecting electrode 109a and a field electrode 120 are formed.

Figure 8B:
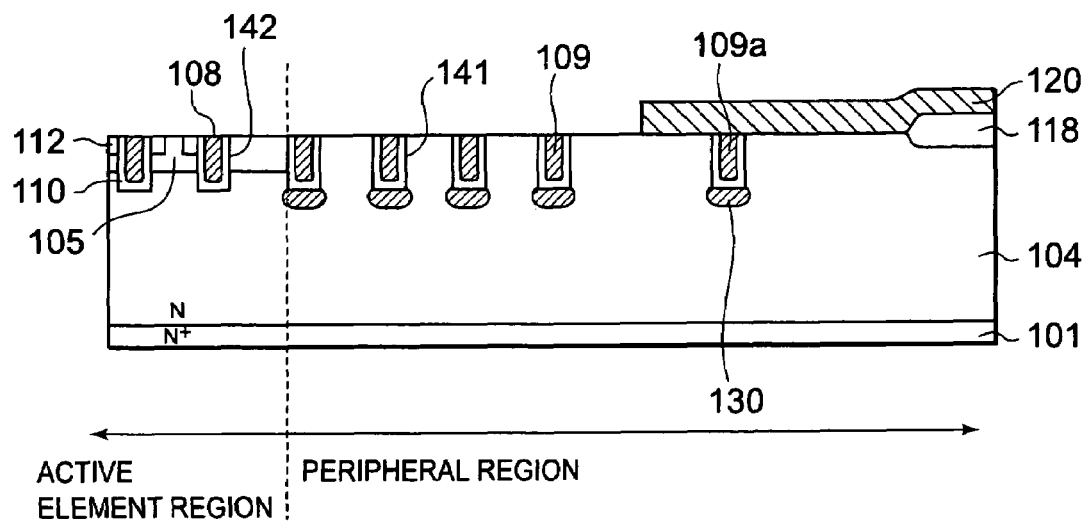

Subsequently, by use of an unillustrated photo resist as a mask, an n$^+$-type source region 112 of a high impurity concentration is formed around the gate electrode 108 on the surface of the p-type base region 105 by the ion implantation of an n-type impurity, for example, arsenic (As). As a result of the foregoing, the structure shown in FIG. 8B is formed.

Figure 9A:
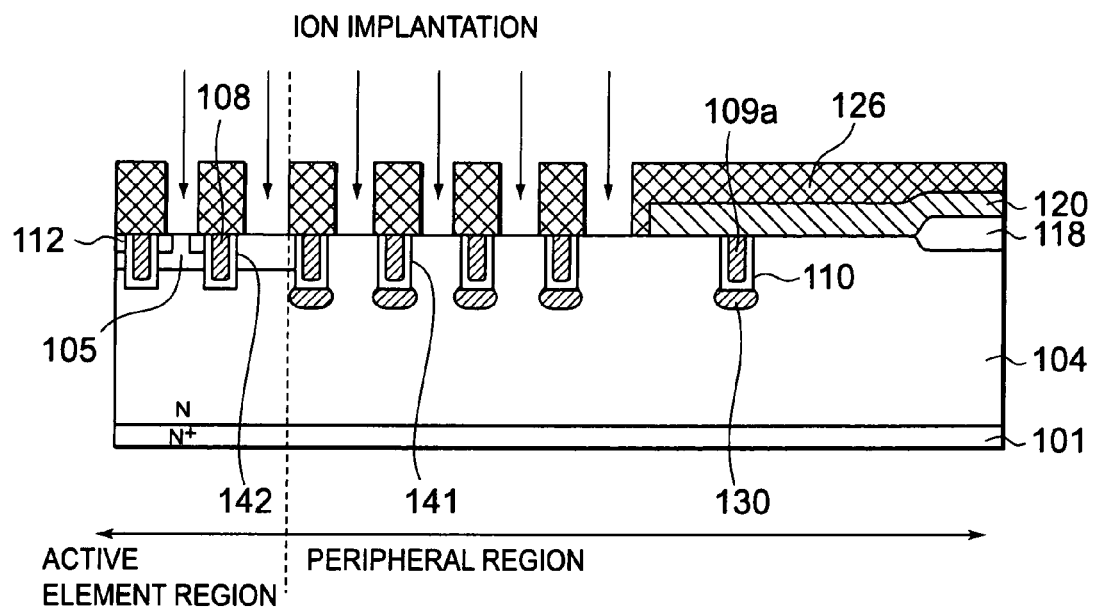
FIGS. 9A and 9A are sectional views of steps that show the manufacturing flow of a semiconductor device in the first embodiment of the present invention.
Figure 9B:
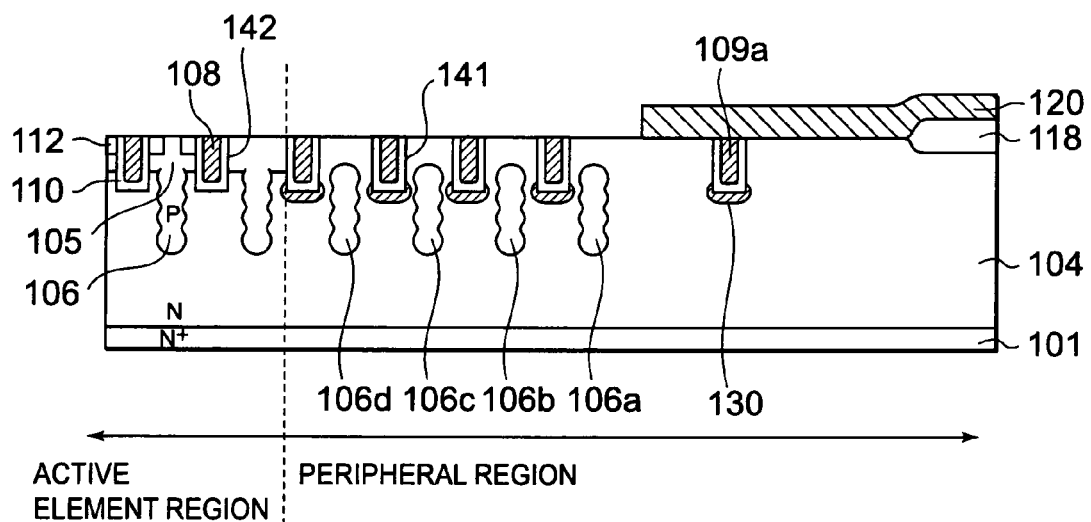

Subsequently, a mask 126 of a prescribed shape is formed and by using this mask, the ion implantation of boron (B), for example, is performed on the surface of the n-type drift region 104 (FIG. 9A). As a result of this, p-type column regions 106, 106a to 106d are formed. This ion implantation can be performed by being divided into a plurality of times and by changing energy each time. After that, the mask 126 is removed (FIG. 9B). In this embodiment, the p-type column regions 106, 106a to 106d are formed with a depth D that does not reach the semiconductor body 101 functioning as an n+-type drain region.

Subsequently, an insulating film 114 is formed on the surface of the n-type drift region 104 and patterned to a prescribed shape. Subsequently, a source electrode 116 and an electrode 124 that are formed from a conductor of aluminum (Al), for example, are formed. Also on the rear surface of the semiconductor body 101, a drain electrode 102 made of aluminum (Al), for example, is formed. As a result of this, a semiconductor device 200 of the construction shown in FIG. 3 is obtained.

The above-described semiconductor device 200 is characterized in that the field electrode 120 is formed before the formation of the p-type column regions 106, 106a to 106d. However, there is no limit as to which of the p-type base region 105, the n+-type source region 112 and the field electrode 120 is to be formed first. These may be formed in an order different from the above-described procedure.

In the above-described semiconductor device 200, there was shown only an example in which the p-type base region 105 is formed only in an area surrounded by the gate electrode 108 in the active element region. However, the p-type base region 105 may also be formed in an area surrounded by the gate electrode 109 in the active element region or in an area extending from the active element region to the end portion of the field electrode 120 on the side of the active element region. Also, there was shown an example in which in the peripheral region, the gate electrode 109 is formed so as to surround each of the p-type column regions 106a to 106d and be connected to the connecting electrode 109a. However, the gate electrode 109 may also be formed so as to surround part of the plurality of p-type column regions in the peripheral region.

In the peripheral region, as described above, the plurality of p-type column regions 106a to 106d are formed. By forming a plurality of p-type column regions in the peripheral region like this, it is possible to keep the breakdown voltage in the peripheral region at a high level. Furthermore, because the field electrode 120 is not formed just above the p-type column regions 106a to 106d formed in the peripheral region, also as a procedure for forming the p-type column regions 106a to 106d after the formation of the field electrode 120, it is possible to make the depth of the p-type column regions 106a to 106d formed in the peripheral region substantially equal to the depth D of the p-type column regions 106 formed in the active element region. Also, it is possible to ensure that all of the p-type column regions, 106, 106a to 106d have an equal profile of an impurity.

Incidentally, in the foregoing, there was shown an example in which the depth of all of the p-type column regions 106a to 106d in the peripheral region is of the same order as the depth D of the p-type column regions 106 of the active element region. However, it is necessary only that at least one of the p-type column regions 106a to 106d has a depth equal to or larger than the depth D of the p-type column regions 106. Particularly, by ensuring that the depth of at least the p-type column region 106d that is disposed in a position closest to the active element region in the peripheral region is at least of the same order as the depth D of the p-type column regions 106 in the active element region, it is possible to effectively raise the breakdown voltage of the peripheral region. Also, thanks to the contribution of the dielectric constant of the element isolating region 118, the outermost p-type column region 106a can maintain the breakdown voltage in the same manner as other regions even when the depth of the outermost p-type column region 106a is smaller than the depth of other regions. Therefore, even when the outermost p-type column region 106a is formed with a depth smaller than the depth of other regions, it is possible to prevent a deterioration in the breakdown voltage of the peripheral region. In this case, the outer most p-type column region 106a may be formed by implanting the p-type impurity through the field electrode 120. In other words, the field electrode 120 may be formed over the outermost p-type column region 106a.

Also, for example, the p-type column regions 106b to 106d formed in the peripheral region can be formed with a depth larger than the depth D of the p-type column regions 106 formed in the active element region. Also, for example, the p-type column regions 106 formed in the active element region and the outermost p-type column region 106a can have a substantially equal depth and the p-type column regions 106b to 106d formed in the peripheral region except the outermost p-type column region 106a can be formed with a depth larger than the p-type column regions 106 of the active element region. Also by adopting these methods, it is possible to make the breakdown voltage of the peripheral region higher than the breakdown voltage of the active element region. Also, the outermost p-type column region 106a can be formed with a depth smaller than the depth of the p-type column regions 106 formed in the active element region and the p-type column regions 106b to 106d (except the outermost p-type column region 106a) formed in the peripheral region can be formed with a depth larger than the p-type column regions 106 formed in the active element region. In this manner, the depth of the p-type column regions 106, 106a to 106d can be appropriately set within the scope in line with the gist of the present invention.

Figure 10:
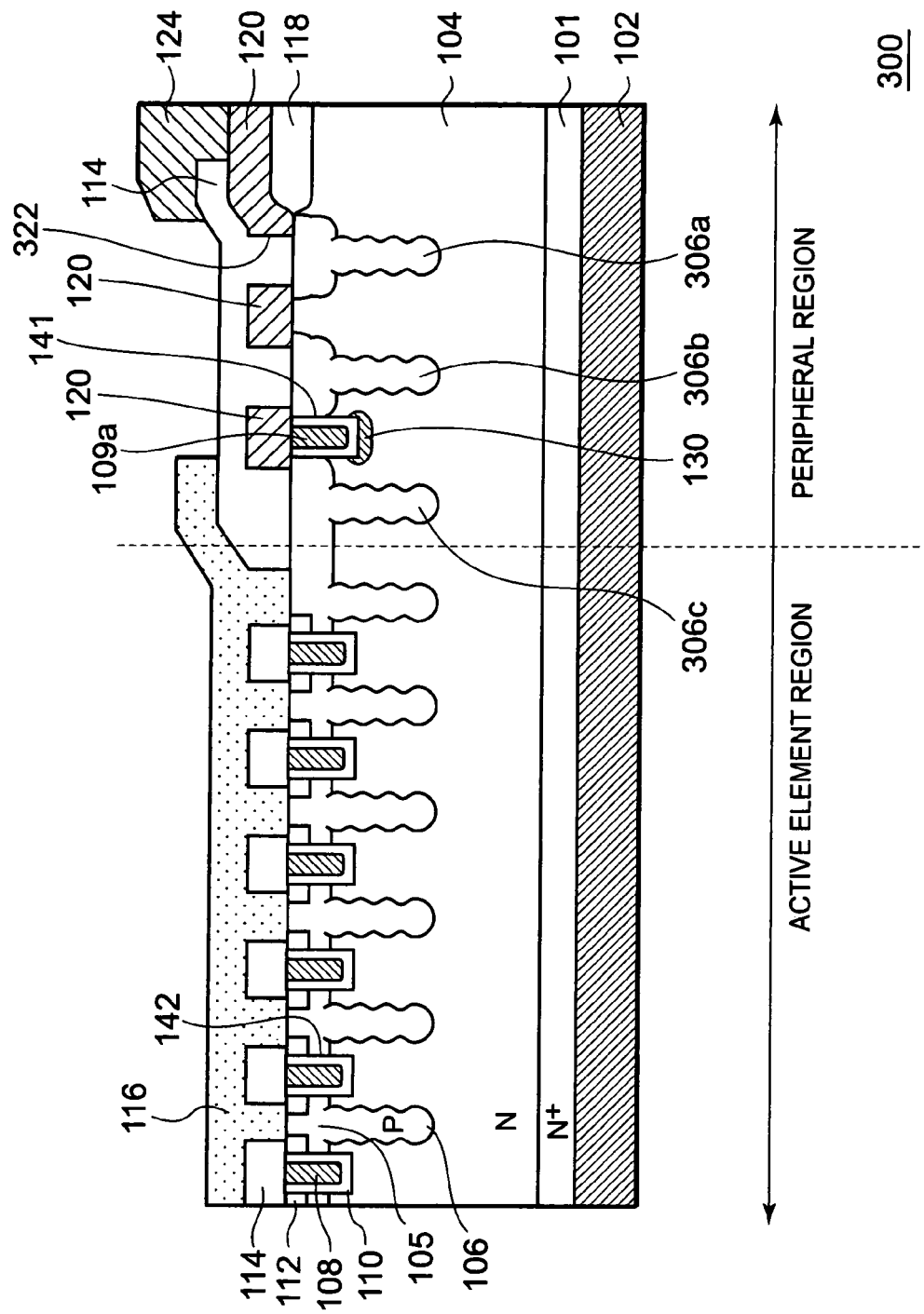
FIG. 10 is a sectional view of a semiconductor device in the second embodiment of the present invention.
Figure 11:
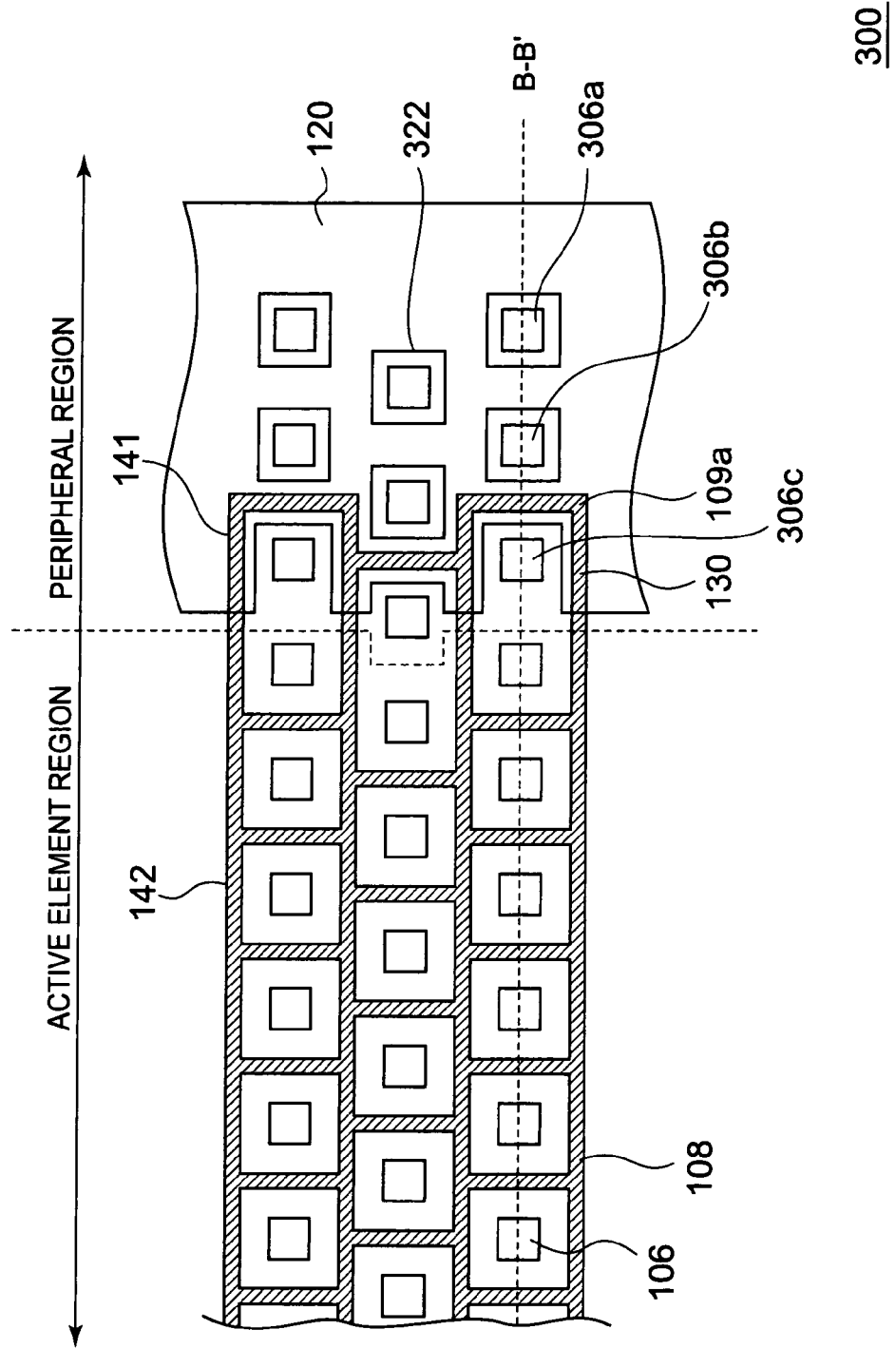
FIG. 11 is a top view of a semiconductor device in the second embodiment of the present invention.

FIGS. 10 and 11 are diagrams that show the construction of a semiconductor device 300 in the second embodiment of the present invention. FIG. 11 is a top view that shows the construction of the semiconductor device 300 in this embodiment. FIG. 10 is a B-B' sectional view of FIG. 11.

The semiconductor device 300 has a construction similar to that of the above-described semiconductor device 200 and includes a vertical power MOSFET having a trench-type gate electrode.

The semiconductor device 300 differs from the above-described semiconductor device 200 in the following point. The semiconductor device 300 is such that in the peripheral region, a field electrode 120 has an opening 322 that is formed at least one of the column regions of said peripheral region closest to the active element region. In the FIGS. 10 and 11, the openings 322 are formed just above p-type column regions 306a, 306b and 306c, respectively. Incidentally, the p-type column regions 306a, 306b and 306c in FIGS. 10 and 11 correspond to the p-type column regions 106a, 106b (or 106c) and 106d of the semiconductor device 200, respectively, in FIGS. 3 and 4. As shown in FIG. 11, the openings 322 are arranged in the form of an island. In the semiconductor device 300, only a connecting electrode 109a connected to the field electrode 120 is arranged in the peripheral region. That is, a first trench 141 is formed only around the p-type column region 306c and is not formed around the p-type column regions 306a and 306b formed outward from the p-type column region 306c.

The semiconductor device 300 has the following construction. In the peripheral region, the column region 306c formed with a depth not less than the depth D of the p-type column regions 106 is formed inward from the end portion the field electrode 120 on the side of the active element region by ion implantation through the opening 322. Also outward from the end portion of the field electrode 120 on the side of the active element field, the column regions 306a and 306b are formed by ion implantation through the openings 322. The openings 322 are formed in the corresponding portions of the field electrode 120 located in areas above the column regions 306a to 306c. In the opening 322 that is formed above the column region 306c closest to the side of the active element field, the portion of the opening 322 on the side of the active element region is open. As shown in FIG. 11, a p-type guard region 130 is formed also in the form of a half-baked mesh under a connecting electrode 109a formed in the form of a half-baked mesh.

The semiconductor device 300 is formed in a procedure similar to the manufacturing process of the first embodiment of the present invention. The manufacturing method of the semiconductor device 300 will be described below with reference to FIGS. 8A, 8B, 9A and 9B. The forming position and arrangement of the first trench 141, the p-type guard region 130, the field electrode 120 and the like are the same as shown in FIG. 11.

As shown in FIGS. 8A and 8B, after the formation of the p-type guard region 130 by selectively forming the first trench 141 in the peripheral region, a second trench 142 is selectively formed in the active element region. Subsequently, a polysilicon layer is formed by the CVD method in the interior of the first and second trenches 141 and 142 and on the surface of an n-type drift region 104. Subsequently, the polysilicon layer in areas other than the interior of the first and second trenches 141 and 142 and a prescribed surface area of the n-type drift region 104 is selectively removed so that the polysilicon layer only in the interior of the first and second trenches 141 and 142 and the prescribed surface area of the n-type drift region 104 is left behind. At this time, this embodiment differs from the first embodiment of the present invention in the point that an opening 322 is formed in the field electrode 120 by selectively removing at least a portion located in an area above the p-type column region 306c closest to the active element region. As a result of this, the p-type column region 306c of the peripheral region closest to the active element region is enabled to be formed with a depth of not less than the depth D of the p-type column regions 106 formed in the active element region because an ion implantation is performed through the opening 322. FIGS. 10 and 11 show the arrangement condition that a plurality of openings 322 are formed above the p-type column regions 306a to 306c, respectively. Therefore, the p-type column regions 306a to 306c are formed with a depth of not less than the depth D. As a result of this, the p-type column regions 306a to 306c of the peripheral region are formed without being covered by the field electrode 120 having the plurality of openings 322 arranged in the form of an island is formed. The remainder of the procedure can be the same as described in connection with the semiconductor device 200.

According to the procedure for manufacturing the semiconductor device 300, as with the semiconductor device 200, the field electrode 120 is not formed just above the p-type column regions 306a to 306c. Therefore; also as a procedure for forming the p-type column regions 306a to 306c after the formation of the field electrode 120, it is possible to make the depth of the p-type column regions 306a to 306c formed in the peripheral region substantially equal to the depth D of the p-type column regions 106 formed in the active element region. This enables the breakdown voltage of the peripheral region to be raised. Because the p-type column regions 306a to 306c are formed after the formation of the field electrode 120, it is possible to reduce the number of heat cycles applied to the semiconductor device 300 after the formation of the p-type column regions 306a to 306c. As a result, a narrow-pitch, fine superjunction structure is realized.

Furthermore, by providing the p-type guard region 130 under the trench-type connecting electrode 109a in the peripheral region, the breakdown voltage in the peripheral region is improved. Furthermore, by minimizing the trench-type gate electrode 109 and the connecting electrode 109a in the peripheral region, it is also possible to reduce a voltage drop between the field electrode 120 and the gate electrode 108.

Also in the semiconductor device 300, the depth of the p-type column regions 106, 306a to 306c of each region can be appropriately set within the scope in line with the gist of the present invention. That is, in the peripheral region, it is necessary only that at least the column region 306c disposed in a position closest to the active element region be formed with a depth not less than the depth D of the p-type column regions 106 formed in the active element region.

Figure 12:
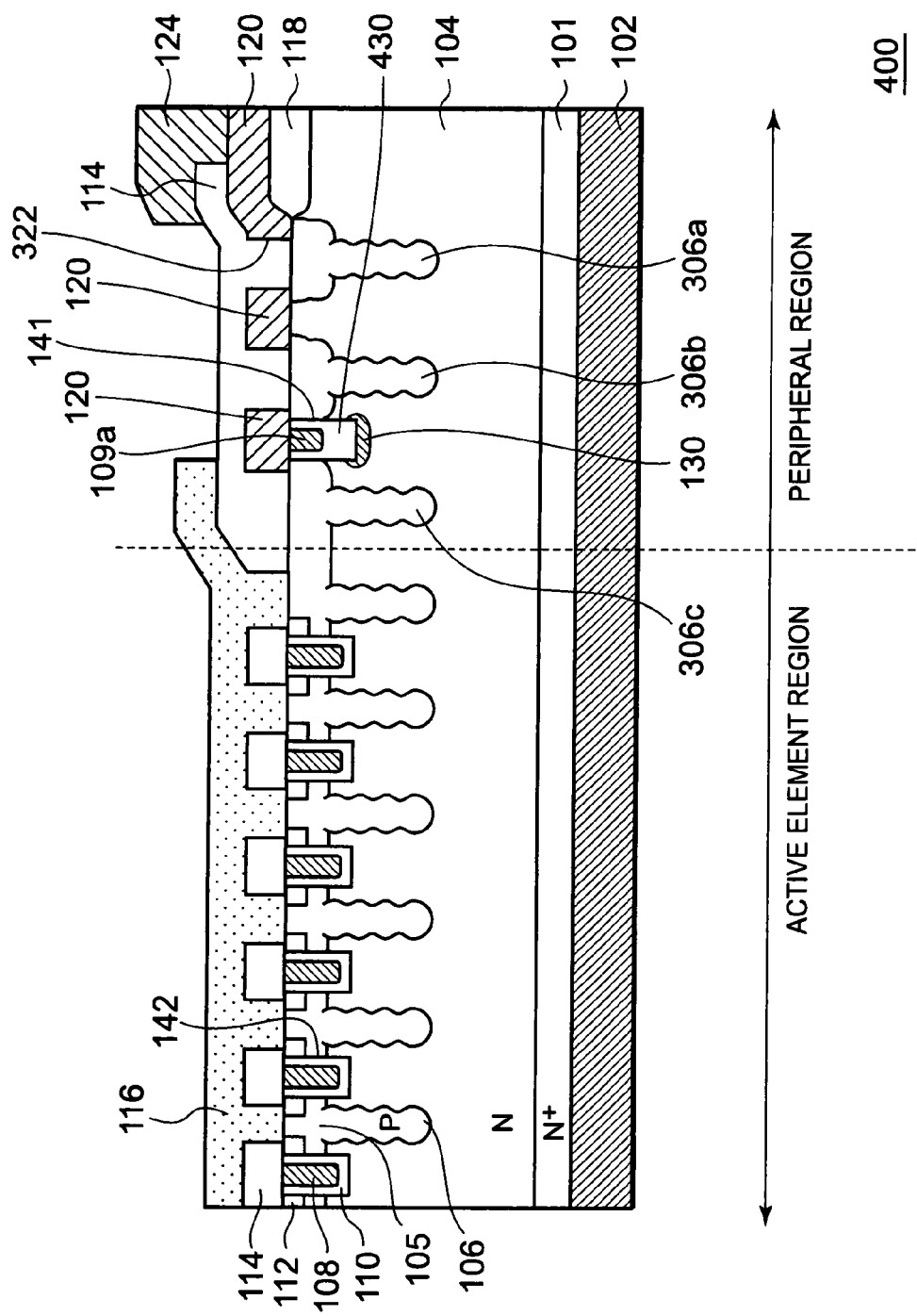
FIG. 12 is a sectional view of a semiconductor device in the third embodiment of the present invention.

FIG. 12 is a diagram that shows the construction of a semiconductor device 400 in the third embodiment of the present invention. A top view of the semiconductor device 400 shows the same construction as shown in FIG. 11. FIG. 12 corresponds to a B-B' sectional view of FIG. 11.

In addition to the construction of the semiconductor device 300 of the second embodiment of the present invention, the semiconductor device 400 has a construction which is such that a guard insulating film 430 having a film thickness larger than a gate insulating film 110 at a bottom of a second trench 142 where a gate electrode 108 is formed. As with a p-type guard region 130, the guard insulating film 430 has the function of a guard region of reducing the electric field density in the peripheral region. The guard insulating film 430 can be constructed so as to have a film thickness that is not less than twice the film thickness of the gate insulating film 110 in the gate electrode 108.

The semiconductor device 400 is formed in a procedure similar to the manufacturing process of the second embodiment of the present invention, with the exception that the guard insulating film 430 is formed after the formation of the first trench 141. The formation of the semiconductor device 400 will be described below with reference to FIGS. 8A, 8B, 9A and 9B.

First, as shown in FIG. 8A, a p-type guard region 130 is formed by selectively forming a first trench 141 in the peripheral region. Subsequently, after the removal of a photo resist 140, a thick insulating film is formed in the interior of the first trench 141 by thermal oxidation, for example, and a guard insulating film 430 (not shown) is left behind in a bottom portion of the first trench 141 by performing etch back. After that, the second trench 142 is formed. After that, in the interior of the first and second trenches 141 and 142, a gate insulating film 110 is formed by thermal oxidation, for example. Therefore, in the first trench 141, the guard insulating film 430 and the gate insulating film 110 are formed in a seamless manner. The film thickness of the guard insulating film 430 is made not less than twice the film thickness of the gate insulating film 110 in the second trench 142. After that, a polysilicon layer is formed by the CVD method in the interior of the first and second trenches 141 and 142 and on the surface of an n-type drift region 104. The remainder of the procedure can be the same as described in connection with the semiconductor device 300.

According to the manufacturing method of the semiconductor device 400, in the same manner as with the semiconductor device 200 and semiconductor device 300 described in the first and second embodiments of the present invention, p-type column regions 106, 306a to 306c are formed after the formation of a field electrode 120. For this reason, it is possible to reduce the number of heat cycles applied to the semiconductor device 400 after the formation of the p-type column regions 106, 306a to 306c. As a result, a narrow-pitch, fine superjunction structure is realized. Furthermore, because the field electrode 120 is arranged in the peripheral region so as to have an opening 322 over at least an area forming the p-type column region 306c closest to the active element region, also in the peripheral region it is possible to form the p-type column region 306c with a depth not less than the depth D of the p-type column regions 106 in the active element region. This enables the breakdown voltage in the peripheral region to be improved.

Furthermore, because the p-type guard region 130 and the guard insulating film 430 are formed in the peripheral region, it is possible to keep the breakdown voltage in the peripheral region at a higher level than the semiconductor device 300 in the second embodiment of the present invention.

Incidentally, the guard insulating film 430 can also be formed also by being caused to grow by the CVD method. Although it is possible to keep the breakdown voltage in the peripheral region at a higher level than in the active element region by forming only the guard insulating film 430 without the formation of the p-type guard region 130, the effect is lower than in the third embodiment of the present invention.

As described above, according to the first to third embodiments of the present invention, one or more of the following advantages are obtained.

(1) By providing the guard region 130 of a conductivity type different from that of the drift region 104 below at least a portion of the gate electrode 109 formed in the first trench 141 closest to the active element region and by providing the guard region 130 is free from being formed below the gate electrode 108 formed in the second trench 142 of the active region, it becomes possible to reduce the electric field density to below the gate electrode 109 closest to the active element region while suppressing deterioration in characteristics, such as an increase in the resistance of the active element region.

(2) By forming the column regions after the formation of the field electrode 120, it becomes possible to reduce the number of heat cycles applied to the semiconductor device after the formation of the column regions. This enables a superjunction structure having a fine pitch to be realized.

(3) By ensuring that the field electrode 120 is not formed on at least one of the column regions disposed at least in a position closest to the active element region of all of the column regions formed in the peripheral region and by forming thereafter the column regions by an ion implantation, it becomes possible to form at least the column regions closest to the active element region with a depth not less than the depth of the column regions formed in the active element region. This enables the breakdown voltage in the peripheral region to be improved.

By any of the techniques (1) to (3) or combining the techniques (1) to (3) above, it is possible to keep the breakdown voltage in the peripheral region at a higher level than in the active element region while maintaining low ON resistance due to a superjunction structure and to raise the breakdown voltage of the whole semiconductor device.

It is apparent that the present invention is not limited to the above embodiments, but may be modified and changed without departing from the scope and spirit of the invention. In the above embodiments, the description was given of a case where a portion of the drift region 104 in the p-n parallel layer has a mesh planar shape. However, the portion of the drift region 104 in the p-n parallel layer may be formed in the form of a plurality of stripes.

In the above embodiments, the description was given of a case where the first conductivity type is an n-type and the second conductivity type is a p-type. It is also possible that the first conductivity type is a p-type and that the second conductivity type is an n-type. Although the description was given by taking a MOSFET as an active element formed in the semiconductor device as an example, the active element is not limited to this. Similar effects are obtained also by forming, for example, an IGBT (Insulated Gate Bipolar Transistor) and a thyristor with gate.

Also for the semiconductor device 200 in the first embodiment of the present invention, the gate insulating film 110 in the interior of the first trench 141 where the gate electrode 109 and the connecting electrode 109a are formed, can have the construction of the guard insulating film 430 and the gate insulating film 110 as in the third embodiment of the present invention.

Furthermore, the p-type guard region 130 may also be formed by the ion implantation of oxygen in dose amounts of not less than $1 \times 10^{15}$ atoms/cm$^2$ in addition to boron. This is effective in reducing the electric field intensity applied to under the first trench 141.

Although the inventions has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor device comprising:
    a drift region of a first conductivity type including an active element region and a peripheral region formed around said active element region;
    a first trench formed in said peripheral region;
    a second trench formed in said active element region;
    a gate insulating film and a gate electrode formed in each of said first and second trenches;
    a base region of a second conductivity type formed at least in said active element region;
    a plurality of column regions of said second conductivity type selectively formed separately from one another in each of said active element region and said peripheral region to thereby form a parallel p-n layer that comprises a portion of said drift region and selected ones of said column regions;
    a source region of said first conductivity type formed in said base region;
    a guard region of said second conductivity type formed below at least a portion of said first trench closest to said active element region, said guard region being free from being formed below said second trench, and
    a field electrode formed over said peripheral region and electrically connected to said gate electrode, said field electrode being formed without covering at least one of said column regions formed in said peripheral region, said at least one of said column regions being closest to said active element region.

2. The semiconductor device according to claim 1, wherein said guard region is formed below an entire area of said first trench.

3. The semiconductor device according to claim 1, wherein said at least one of said column regions formed in said peripheral region is formed with a depth of not less than a depth D of said plurality of column regions formed in said active element region, and said field electrode is free from being formed at least just above said column region having a depth of not less than depth D.

4. The semiconductor device according to claim 3, wherein said column region having a depth of not less than depth D in said peripheral region is formed outward from an end portion closest to said active element region of said field electrode.

5. The semiconductor device according to claim 3, wherein the semiconductor device further comprises a connecting electrode that is formed in said peripheral region and is connected to said gate electrode and said field electrode, and said column region having a depth of not less than said depth D in said peripheral region is located outward from a connecting portion between said connecting electrode and said field electrode.

6. The semiconductor device according to claim 1, wherein all of said column regions formed in said peripheral region are formed with a depth of not less than said depth D of said plurality of column regions formed in said active element region.

7. The semiconductor device according to claim 1, wherein said field electrode has an opening that is formed over at least one of said column regions formed in said peripheral region.

8. The semiconductor device according to claim 1, further comprises a guard insulating film that is formed at a bottom of said first trench, said guard insulating film having a film thickness larger than said gate insulating film formed in said second trench.

9. The semiconductor device according to claim 1, wherein said first trench is formed so as to surround a circumference of each of said column regions as viewed on a horizontal plane also in said peripheral region.

10. The semiconductor device according to claim 1, wherein said field electrode is formed outward from all of said column region.

11. The semiconductor device according to claim 1, wherein said field electrode is formed over at least one of said column regions.

12. The semiconductor device according to claim 1, wherein all of said column regions formed in said active element region and said peripheral region have an impurity profile that is substantially equal.

13. The semiconductor device according to claim 1, wherein the shape of said portion of said drift region forming said parallel p-n layer is in the form of a mesh as viewed on a horizontal plane.

14. The semiconductor according to claim 1, wherein the shape of said portion of said drift region forming said parallel p-n layer is in the form of a plurality of stripes as viewed on a horizontal plane.

15. The semiconductor device according to claim 1, wherein said plurality of column regions are arranged in the form of a plurality of islands and have a plane arrangement in the form of an orthorhombic lattice.

16. The semiconductor device according to claim 1, wherein the semiconductor device further comprises a drain region of said first conductivity type formed below said drift region and said column region is formed with a depth that is free from reaching said drain region at least in said active element region.

17. A method for manufacturing a semiconductor device, comprising:
   forming a drift region of a first conductivity type including an active element region and a peripheral region formed around said active element region;
   forming a first trench in said peripheral region;
   forming a guard region by introducing an impurity of a second conduction type into a bottom of said first trench;
   forming a second trench in said active element region;
   forming a gate insulating film in each of said first and second trenches;
   forming a gate electrode in each of said first and second trenches and forming a field electrode electrically connected to said gate electrode over said peripheral region;
   forming a plurality of column regions of said second conductivity type in each of said active element region and said peripheral region,
   forming a base region of said second conductivity type at least in said active element region; and
   forming a source region of said first conductivity type in said base region,
   wherein said field electrode is formed without covering at least one of said column regions formed in said peripheral region, said at least one of said column regions being closest to said active element region.

18. The method of manufacturing a semiconductor device, according to claim 17, wherein said forming said gate insulating film further includes forming a guard insulating film that is thicker than said gate insulating film formed in said second trench at a bottom of said first trench.

* * * * *